US010634726B2

(12) United States Patent
Ishikawa et al.

(10) Patent No.: US 10,634,726 B2
(45) Date of Patent: Apr. 28, 2020

(54) VOLTAGE DETECTING DEVICE AND VOLTAGE DETECTING METHOD

(71) Applicant: FUJITSU TEN LIMITED, Kobe-shi, Hyogo (JP)

(72) Inventors: Yukio Ishikawa, Kobe (JP); Kensuke Matsuda, Kobe (JP); Masahiko Kusaki, Kobe (JP)

(73) Assignee: FUJITSU TEN Limited, Kobe (JP)

( * ) Notice: Subject to any disclaimer, the term of this patent is extended or adjusted under 35 U.S.C. 154(b) by 221 days.

(21) Appl. No.: 15/605,103

(22) Filed: May 25, 2017

(65) Prior Publication Data
US 2018/0017625 A1    Jan. 18, 2018

(30) Foreign Application Priority Data

Jul. 13, 2016 (JP) ................................. 2016-138491

(51) Int. Cl.
  *G01R 31/3835*  (2019.01)
  *H02J 7/00*  (2006.01)
  *G01R 31/396*  (2019.01)
  *G01R 31/392*  (2019.01)

(52) U.S. Cl.
  CPC ....... *G01R 31/3835* (2019.01); *G01R 31/396* (2019.01); *H02J 7/0021* (2013.01); *H02J 7/0032* (2013.01); *H02J 7/0068* (2013.01); *G01R 31/392* (2019.01); *Y02T 10/7055* (2013.01)

(58) Field of Classification Search
  CPC .... G01R 31/362; H02J 7/0021; H02J 7/0032; H02J 7/0068; H02J 7/0013; Y02T 10/7055

USPC .................................................. 324/426–437
See application file for complete search history.

(56) References Cited

U.S. PATENT DOCUMENTS

| 2009/0015206 A1* | 1/2009 | Seman, Jr. ............ | H02J 7/0019 320/134 |
| 2011/0057659 A1* | 3/2011 | Ishikawa ............ | G01R 31/3658 324/434 |
| 2013/0067256 A1* | 3/2013 | Shiraishi ............... | G06F 1/3212 713/320 |
| 2014/0225620 A1* | 8/2014 | Campbell ........... | B60L 11/1838 324/426 |
| 2015/0340883 A1* | 11/2015 | Kanai ................. | H01M 10/482 320/118 |

(Continued)

FOREIGN PATENT DOCUMENTS

| JP | 2014-033604 | * | 2/2014 | ............ H01M 10/48 |
| JP | 2014-033604 A |   | 2/2014 | |

*Primary Examiner* — Jeff W Natalini
(74) *Attorney, Agent, or Firm* — Oliff PLC (57) ABSTRACT

A voltage detecting device according to an aspect of embodiments includes a detecting unit and a mode switching unit. The detecting unit detects voltages of battery cells of a battery stack in which the battery cells are connected to each other. The mode switching unit switches between an active mode in which the detecting unit detects the voltages and a standby mode in which a current flowing into the detecting unit is less than a predetermined value. Moreover, the detecting unit includes a voltage detecting unit that detects the voltages of the battery cells and/or a voltage of a power supply of the detecting unit in a predetermined interval. The mode switching unit switches between the active mode and the standby mode in accordance with a timing at which the voltage detecting unit detects the voltage (s).

6 Claims, 9 Drawing Sheets

(56) References Cited

U.S. PATENT DOCUMENTS

2017/0219659 A1* 8/2017 Ishikawa ............ G01R 31/3835

* cited by examiner

VOLTAGE DETECTING DEVICE AND VOLTAGE DETECTING METHOD

CROSS-REFERENCE TO RELATED APPLICATION

This application is based upon and claims the benefit of priority of the prior Japanese Patent Application No. 2016-138491, filed on Jul. 13, 2016, the entire contents of which are incorporated herein by reference.

FIELD

The embodiments discussed herein are directed to a voltage detecting device and a voltage detecting method.

BACKGROUND

Conventionally, an assembled battery in which battery stacks having a plurality of battery cells are connected to each other has been used as a power supply of an electric vehicle, a hybrid vehicle, etc. A device that monitors the assembled battery is connected to the assembled battery. The device detects the voltage of each battery cell of the assembled battery and discharges the battery cell in accordance with the detected voltage so as to adjust the capacity balance of the corresponding battery cell (see Japanese Laid-open Patent Publication No. 2014-033604).

However, the patent literature does not disclose that the device monitors an assembled battery and diagnoses a failure of battery cells.

A monitoring device detects the source voltage of a monitoring circuit or/and the voltage during the discharge and undischarge of battery cells in order to perform a failure diagnosis of a monitoring circuit and the battery cells. At this time, when detecting a voltage by using a free-running A/D converter that periodically operates regardless of the control of a monitoring device, for example, it is needed to perform a failure diagnosis in accordance with the operation period of the A/D converter, and thus a time needed for a diagnosis becomes longer. Moreover, when errors are included in the operation period of the A/D converter, for example, it is needed to perform a failure diagnosis in consideration of the impact of the errors. A time needed for a diagnosis becomes longer due to the impact of the errors.

As described above, because a time for adjusting capacity balance becomes shorter when a time needed for a failure diagnosis becomes longer, it is desired to reduce a diagnosis term of a failure.

SUMMARY

It is an object of the present invention to at least partially solve the problems in the conventional technology. A voltage detecting device according to the embodiment includes a detecting unit and a mode switching unit. The detecting unit detects voltages of battery cells of a battery stack in which the battery cells are connected to each other. The mode switching unit switches between an active mode in which the detecting unit detects the voltages and a standby mode in which a current flowing into the detecting unit is less than a predetermined value. The detecting unit comprises a voltage detecting unit that detects the voltages of the battery cells and/or a voltage of a power supply of the detecting unit in a predetermined interval. The mode switching unit switches between the active mode and the standby mode in accordance with a timing at which the voltage detecting unit detects the voltage(s). The above and other objects, features, advantages and technical and industrial significance of this invention will be better understood by reading the following detailed description of presently preferred embodiments of the invention, when considered in connection with the accompanying drawings.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF EMBODIMENTS

Hereinafter, exemplary embodiments of a voltage detecting device and a voltage detecting method disclosed in the present application will be explained in detail with reference to the accompanying drawings. In addition, the embodiments disclosed below are not intended to limit the present invention.

First Embodiment

Figure 1A:
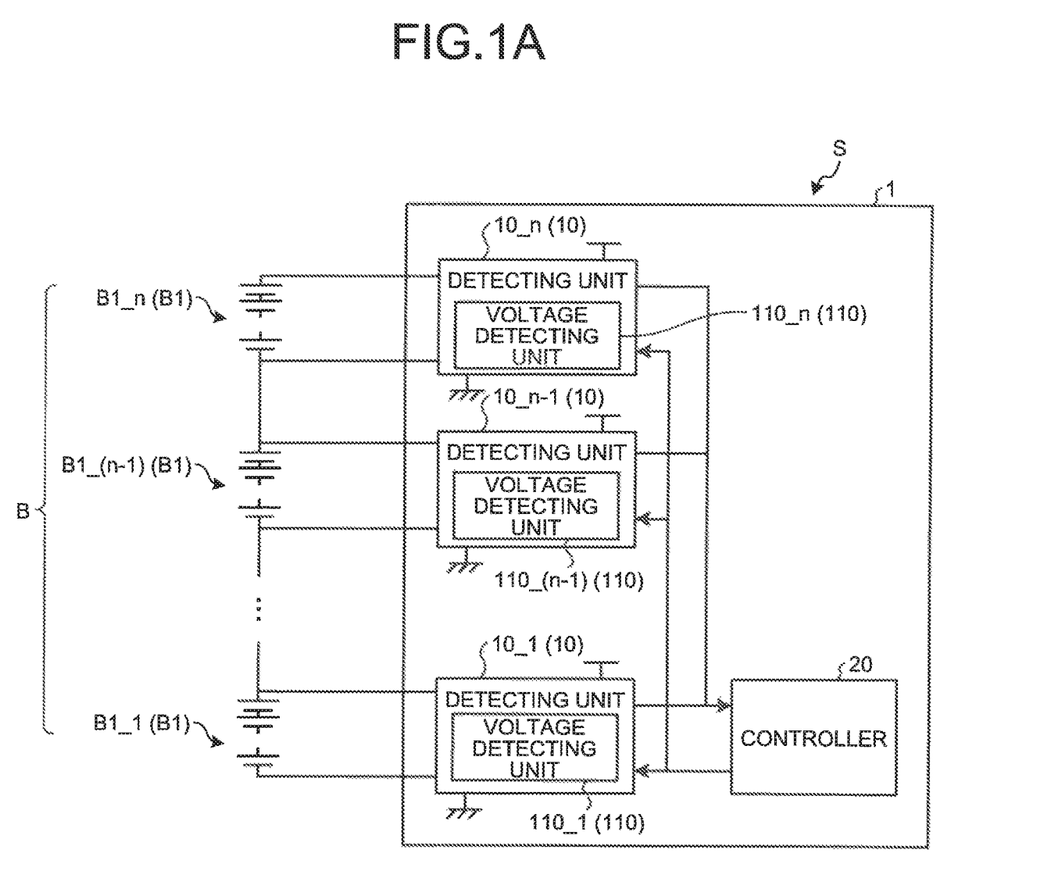
FIGS. 1A to 1C, are diagrams explaining a voltage detecting method according to a first embodiment.
Figure 1B:
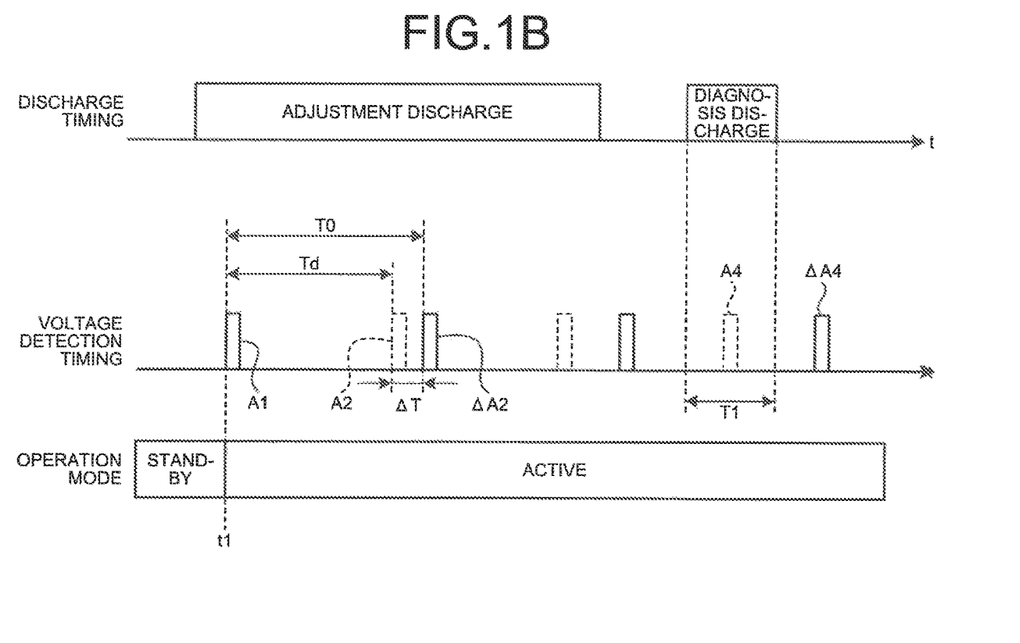
Figure 1C:
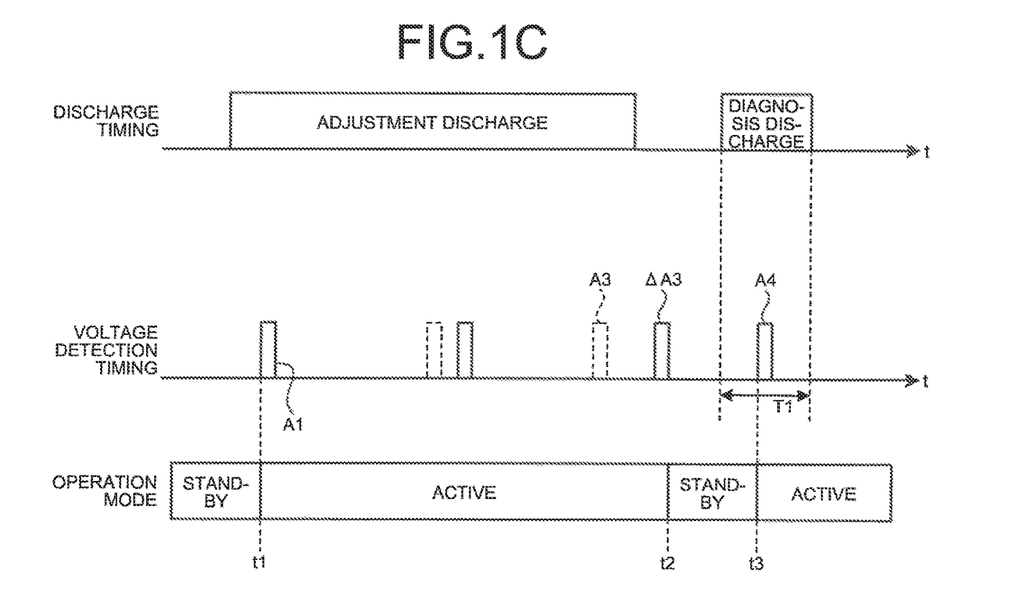

A voltage detecting method according to the first embodiment will be explained by using FIGS. 1A to 1C. FIGS. 1A to 1C are diagrams explaining the voltage detecting method according to the present embodiment. The voltage detecting method according to the present embodiment is a method for detecting each cell voltage of battery stacks $B1\_n$ (n is natural number of 1 to N) of an assembled battery B that is used as a power supply of an electric vehicle, a hybrid vehicle, etc. Therefore, the outline of an assembled battery system S that includes the assembled battery B will be first explained by using FIG. 1A.

The assembled battery system S of FIG. 1A includes the assembled battery B and a voltage detecting device 1. The assembled battery B includes the plurality of battery stacks $B1\_n$ (hereinafter, also referred to as battery stack B1) that are serially connected to each other. The battery stack $B1\_n$ includes a plurality of battery cells that are serially connected to each other.

The voltage detecting device 1 includes detecting units $10\_n$ (hereinafter, also referred to as detecting unit 10), which respectively detect the voltages of the battery cells included in the battery stack $B1\_n$, and a controller 20 that controls the detecting unit $10\_n$. The voltage detecting method according to the present embodiment is performed by the voltage detecting device 1.

As illustrated in FIG. 1B, the voltage detecting device 1 operates to switch between an active mode in which the voltages of the battery cells included in the battery stack B1_$n$ are detected and a standby mode in which currents flowing into the detecting unit 10_$n$ are less than a predetermined value.

When the mode of the voltage detecting device 1 becomes the active mode, the detecting unit 10_$n$ includes a voltage detecting unit 110_$n$ (hereinafter, also referred to as voltage detecting unit 110) that detects the voltages (hereinafter, referred to as cell voltages) of the battery cells included in the battery stack B1_$n$ in a predetermined interval T0 as illustrated in FIG. 1B.

The voltage detecting unit 110 includes, for example, an A/D converter that is not illustrated, and detects the voltages of the battery cells in the predetermined interval T0 regardless of the control of the controller 20 to operate in a so-called free-running manner. The voltage detecting unit 110 is connected to both ends of each battery cell of the battery stack B1. In FIG. 1A, in order to simplify the drawing, the illustration of a connecting line connecting the voltage detecting unit 110 and each battery cell is omitted.

As illustrated in FIG. 1B, the detecting unit 10 performs adjustment discharge for discharging each battery cell of the battery stack B1 in order to adjust the balance of a corresponding cell voltage of the battery stack B1 in accordance with an instruction from the controller 20. Furthermore, the detecting unit 10 forcibly discharges or undischarges each battery cell of the battery stack B1 in accordance with an instruction from the controller 20. The controller 20 performs diagnosis of whether the detecting unit 10 and the battery stack B1 have a failure such as breaking of wire on the basis of the cell voltage during the discharge and undischarge. Hereinafter, discharge and undischarge performed by the detecting unit 10 for the sake of the diagnosis are referred to as diagnosis discharge and diagnosis undischarge, respectively.

Herein, as described above, the voltage detecting unit 110 detects a cell voltage in the predetermined interval T0 in accordance of the control of the controller 20. At this time, the predetermined interval T0 may have an error $\Delta T$ so as to deviate from a desired time interval Td.

The voltage detecting unit 110 detects a cell voltage in a predetermined term A1 from a timing t1 at which the mode of the voltage detecting device 1 is switched to an active mode. After that, when the error $\Delta T$ does not occur, the voltage detecting unit 110 detects a cell voltage in a predetermined term A2 after the desired time interval Td has elapsed from the timing t1.

However, when the error $\Delta T$ is included in the predetermined interval T0, the voltage detecting unit 110 detects a cell voltage in a predetermined term $\Delta A2$ after the desired time interval Td and the error $\Delta T$ have elapsed from the timing t1.

When the error $\Delta T$ is accumulated, the voltage detecting unit 110 wants to detect a cell voltage in a predetermined term A4 within a diagnosis term T1 in which diagnosis discharge is performed, for example, but may detect a cell voltage in a predetermined term $\Delta A4$ out of the diagnosis term T1.

If the voltage detecting unit 110 is going to detect a cell voltage when performing diagnosis discharge even when the error $\Delta T$ occurs as described above, the controller 20 is needed to set the diagnosis term T1 in consideration of the impact of the error $\Delta T$. For that reason, there is a problem that the diagnosis term T1 becomes longer. When the diagnosis term T1 becomes longer, the time interval of adjustment discharge becomes shorter, and thus the adjustment of capacity balance of the assembled battery B becomes insufficient.

Therefore, in the voltage detecting method according to the present embodiment, we focus attention on a point that the voltage detecting unit 110 detects a cell voltage in the predetermined interval T0 from the timing t1 at which the mode of the voltage detecting device 1 is switched from a standby mode to an active mode. Depending on the focused point, the voltage detecting device 1 switches between a standby mode and an active mode in accordance with timing, for detecting a cell voltage, as in the diagnosis term T1, for example.

Specifically, as illustrated in FIG. 1C, the voltage detecting device 1 switches the mode from an active mode to a standby mode at a timing t2 prior to the diagnosis term T1 so that the voltage detecting unit 110 operates within the diagnosis term T1 to detect a cell voltage. As a result, the voltage detecting unit 110 stops detecting the cell voltage.

Next, the voltage detecting device 1 switches the mode from a standby mode to an active mode at a timing t3 within the diagnosis term T1. As a result, the voltage detecting unit 110 resumes detecting the cell voltage. At this time, the voltage detecting unit 110 again performs voltage detection in the predetermined interval T0 from the timing t3. Therefore, even if a predetermined term $\Delta A3$ in which the voltage detecting unit 110 detects a cell voltage deviates from a desired time interval A3 before the timing t3, the voltage detecting unit 110 can detect the cell voltage in the predetermined term A4 within the diagnosis term T1.

As described above, the voltage detecting method according to the present embodiment can switch between an active mode and a standby mode in accordance with a timing for detecting a cell voltage so as to detect the cell voltage at a desired timing. As a result, because the voltage detecting device 1 can set the diagnosis term T1 without consideration of the error $\Delta T$, the diagnosis term T1 can be shortened. For that reason, the voltage detecting device 1 can lengthen the time interval of adjustment discharge, and thus can lengthen a time for adjusting capacity balance of the assembled battery B.

Herein, it has been explained that the error $\Delta T$ occurs to be delayed from the desired time interval Td, namely, an interval in which the voltage detecting unit 110 detects a cell voltage becomes long. However, the present embodiment is not limited to this. The voltage detecting method described above can be applied to a case where the error $\Delta T$ occurs ahead of the desired time interval Td, for example, namely, an interval in which the voltage detecting unit 110 detects a cell voltage becomes short. Also in this case, the voltage detecting device 1 switches between an active mode and a standby mode in accordance with timing at which it wants to detect a cell voltage, as in the diagnosis term T1, for example. As a result, the voltage detecting device 1 can shorten the diagnosis term T1. Hereinafter, the assembled battery system S including the voltage detecting device 1 will be further explained.

Figure 2:
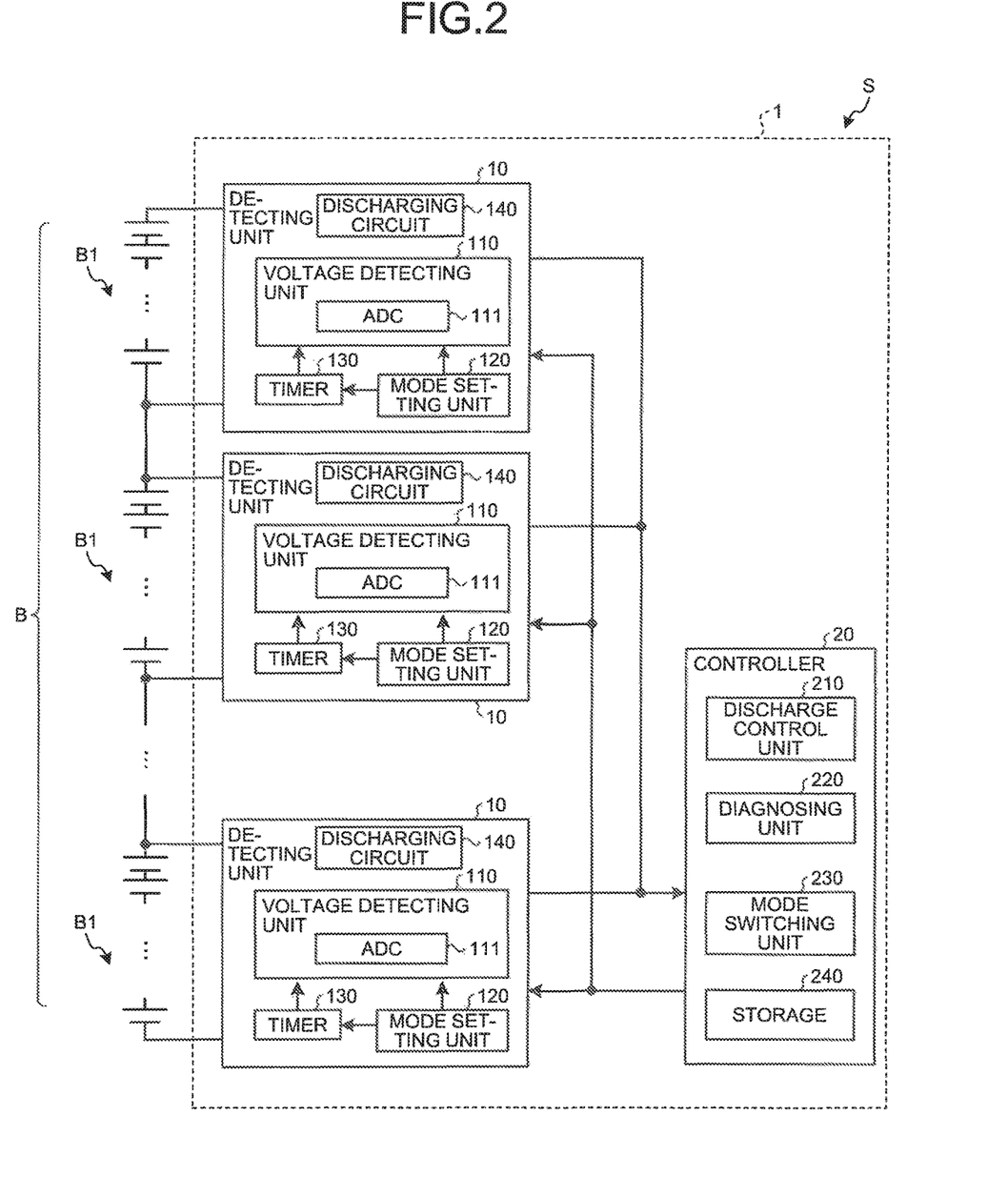
FIG. 2 is a diagram illustrating a configuration example of an assembled battery system according to the first embodiment.

FIG. 2 is a diagram illustrating a configuration example of the assembled battery system S according to the present embodiment. The assembled battery system S illustrated in FIG. 2 includes the assembled battery B and the voltage detecting device 1 that detects the voltages of battery cells included in the assembled battery B.

The assembled battery B includes the plurality of battery stacks B1 serially connected to via connecting members.

Each of the plurality of battery stacks B1 includes a plurality of battery cells that are serially connected to each other.

The voltage detecting device 1 includes the detecting units 10 that detect the voltages of the battery cells and the controller 20 that controls the detecting units 10.

The plurality of detecting units 10 respectively detect the voltages of the battery cells included in the plurality of battery stacks B1 every the predetermined interval T0. Moreover, the detecting units 10 have the same configuration and operation. The detecting units 10 are connected to the battery cells in parallel, for example. In order to simplify the drawing, the illustration of connecting lines for connecting the detecting units 10 and the battery cells is omitted in FIG. 2. Each of the plurality of detecting units 10 includes the voltage detecting unit 110, a mode setting unit 120, a timer 130, and a discharging circuit 140.

The voltage detecting unit 110 detects the voltages of the battery cells included in the battery stack B1. The voltage detecting unit 110 further includes an A/D converter (ADC) 111. The A/D converter 111 converts a cell voltage into a digital signal in accordance with an instruction from the timer 130 every the predetermined interval T0 from a timing at which a mode switching unit 230 switches the mode from a standby mode to an active mode. As a result, the voltage detecting unit 110 detects the cell voltages in the predetermined interval T0 regardless of the control of the controller 20. The controller 20 acquires the cell voltages from the A/D converters 111 at a desired timing. It is assumed that the controller 20 acquires the cell voltages from the A/D converters 111 via registers not illustrated.

The mode setting unit 120 switches the operation mode of the voltage detecting unit 110 between an active mode and a standby mode in accordance with an instruction from the controller 20. Specifically, the mode setting unit 120 switches the operation mode of the timer 130 and the voltage detecting unit 110 between an active mode and a standby mode.

The timer 130 counts a time and notifies the voltage detecting unit 110 of the predetermined interval T0. Because the time counted by the timer 130 includes a predetermined error, the predetermined interval T0 is a time obtained by adding the error $\Delta T$ to the desired time interval Td.

When the mode is switched from an active mode to a standby mode, the timer 130 returns the time during counting to an initial value. As a result, the timer 130 starts to count a time from the timing at which the mode is switched from a standby mode to an active mode. For that reason, the voltage detecting unit 110 detects a cell voltage every the predetermined interval T0 from the timing at which the mode is switched from a standby mode to an active mode.

The discharging circuit 140 discharges the battery cells in accordance with an instruction from the controller 20, The discharging circuit 140 includes, for example, a discharging resistor and a switch that are not illustrated. The discharging circuit 140 switches between on and off of the switch to connect the discharging resistor to the battery cell and thus discharges the battery cell.

The controller 20 controls the detecting unit 10 to control the discharge of the battery cell and to acquire the voltage of the battery cell from the detecting unit 10. Moreover, the controller 20 controls the operation mode of the detecting unit 10 to be one of a standby mode and an active mode. The controller 20 includes a discharge control unit 210, a diagnosing unit 220, the mode switching unit 230, and a storage 240.

Figure 3:
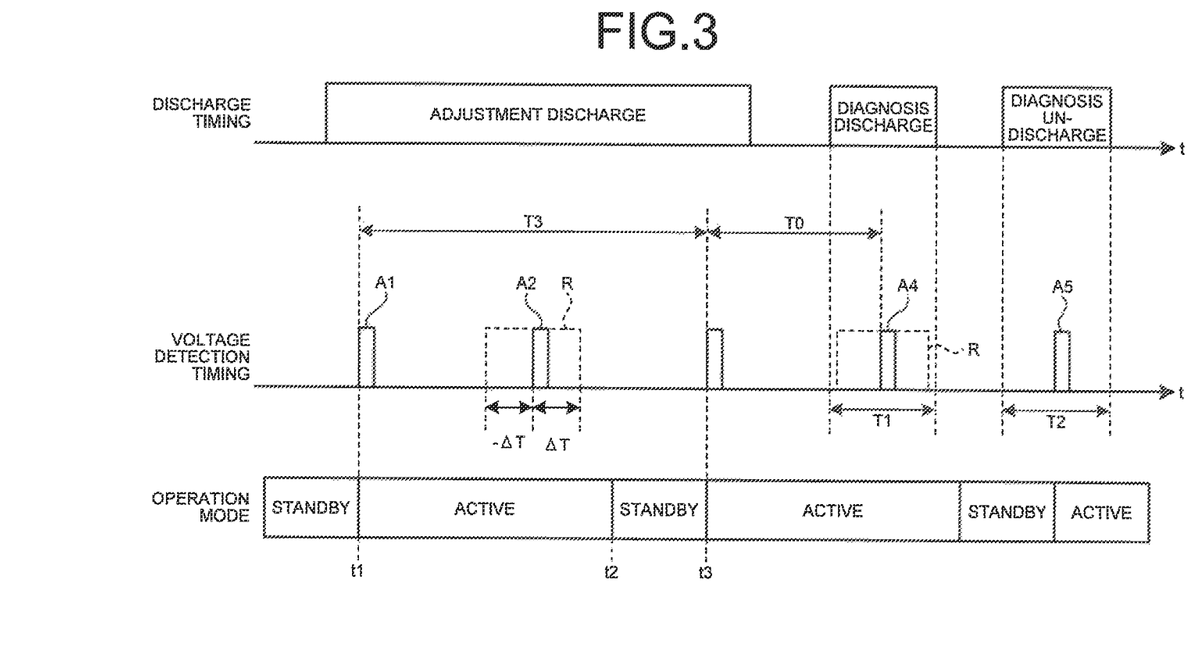
FIG. 3 is a diagram explaining operation timings of components of a voltage detecting device.

The discharge control unit 210 controls the discharge of each battery cell. As illustrated in FIG. 3, the discharge control unit 210 controls the discharging circuit 140 to perform adjustment discharge for adjusting capacity balance of the battery cells in accordance with the cell voltages detected by the detecting unit 10. The discharge control unit 210 controls the switch of the discharging circuit 140 to be on in a time interval in which adjustment discharge is performed on the discharging circuit 140 connected to the battery cell for adjustment discharge. FIG. 3 is a diagram explaining operation timings of components of the voltage detecting device 1.

The discharge control unit 210 controls the discharging circuit 140 to forcibly discharge the battery cell for the sake of a failure diagnosis. Alternatively, the discharge control unit 210 controls the discharging circuit 140 not to discharge the battery cell for the sake of a failure diagnosis. When discharging the battery cell for the sake of a failure diagnosis, the discharge control unit 210 turns on the switch of the discharging circuit 140. On the other hand, when not discharging the battery cell for the sake of the failure diagnosis, the discharge control unit 210 turns off the switch of the discharging circuit 140.

The diagnosing unit 220 performs a failure diagnosis of the assembled battery B and the detecting unit 10. The diagnosing unit 220 acquires the cell voltage from the detecting unit 10 in the diagnosis term T1 in which diagnosis discharge is performed or in a diagnosis term T2 in which diagnosis undischarge is performed. The diagnosing unit 220 determines whether the assembled battery B and the detecting unit 10 break down on the basis of the acquired cell voltages. It is assumed that the diagnosing unit 220 performs a failure diagnosis with a predetermined period T4 during running, for example.

The mode switching unit 230 switches the operation mode of the detecting unit 10 between an active mode and a standby mode. The mode switching unit 230 switches the operation mode of the detecting unit 10 on the basis of a timing at which the discharge control unit 210 performs diagnosis discharge or diagnosis undischarge of the battery cell.

The mode switching unit 230 controls the operation mode to repeat an active mode in a predetermined period T3 depending on the period T4 in which the failure diagnosis is performed. In the example illustrated in FIG. 3, the mode switching unit 230 switches the mode from a standby mode to an active mode at the timing t1, and then switches the mode to the standby mode at the timing t2. The mode switching unit 230 switches the mode from the standby mode to the active mode at the timing t3 at which the predetermined period T3 has elapsed from the timing t1.

As a result, the timer 130 of the detecting unit 10 is reset at the timing t2, and the voltage detecting unit 110 of the detecting unit 10 detects a cell voltage from the timing t3 every the predetermined interval T0 as illustrated in FIG. 3.

When the assembled battery B or the detecting unit 10 breaks down, it is extremely important that the diagnosing unit 220 accurately performs a failure diagnosis because an undesirable state is caused like the assembled battery B becomes an overcharge condition. As described above, the error $\Delta T$ is included in the predetermined interval T0 in which the detecting unit 10 detects the cell voltage. For that reason, if an operating time of the detecting unit 10 becomes long, the predetermined interval T0 may largely deviate from the desired time interval Td for detecting the voltage due to the accumulation of the error $\Delta T$.

When the detecting unit is going to surely detect a cell voltage within the diagnosis terms T1 and T2 while considering an impact of the error $\Delta T$, it is needed to set the diagnosis terms T1 and T2 to be long. On the other hand, if the diagnosis terms T1 and T2 are long, a time interval in which adjustment discharge is performed becomes short and thus capacity balance of the assembled battery B cannot be adequately adjusted.

Therefore, in the present embodiment, it has been explained that the mode switching unit 230 switches an operation mode in the predetermined period T3 depending on the period T4 in which the failure diagnosis is performed. As a result, even if the diagnosis terms T1 and T2 are short, a cell voltage can be separately detected in predetermined terms A4 and A5 within the diagnosis terms T1 and T2, For that reason, the diagnosing unit 220 can more accurately perform a failure diagnosis even if the diagnosis terms T1 and T2 are short.

In the example illustrated in FIG. 3, the mode switching unit 230 switches the operation mode from an active mode to a standby mode when the voltage detecting unit 110 detects a cell voltage twice in predetermined terms A1 and A2. As a result, when the voltage detecting unit 110 detects a cell voltage twice in the predetermined terms A1 and A2, the timer 130 is reset and the error ΔT included in the predetermined interval T0 is reset. For that reason, a total amount of errors that are accumulated by repeating the predetermined interval T0 can be suppressed into one error range R included in the predetermined interval T0.

In other words, when the error ΔT to become longer than the desired time interval Td and the error −ΔT to become shorter than the desired time interval Td are in the predetermined interval T0, for example, the voltage detecting unit 110 detects a cell voltage within the error range R. Therefore, the voltage detecting device 1 can set the diagnosis terms T1 and T2 including the error range R to detect a cell voltage within the diagnosis terms T1 and T2. As described above, the voltage detecting device 1 can shorten the diagnosis terms T1 and T2 as much as the error range R.

In FIG. 3, it has been explained that the mode switching unit 230 switches an operation mode if the voltage detecting unit 110 detects a cell voltage twice in the predetermined terms A1 and A2. However, the present embodiment is not limited to this. The mode switching unit 230 can switch an operation mode when the voltage detecting unit 110 detects a cell voltage by a predetermined number of times. Therefore, the number of times may be twice or more, or be once. The number of times can be changed in accordance with a time needed for switching an operation mode, the period T4 for performing a diagnosis, or the like.

The storage 240 stores therein information, needed for processes performed by the components of the controller 20, such as the period T4 in which the diagnosing unit 220 performs a failure diagnosis. Moreover, the storage 240 stores information needed by the components of the controller 20. The storage 240 is a semiconductor memory device, such as RAM (Random Access Memory) and a flash memory, or a storage device such as a hard disk and an optical disc.

Figure 4:
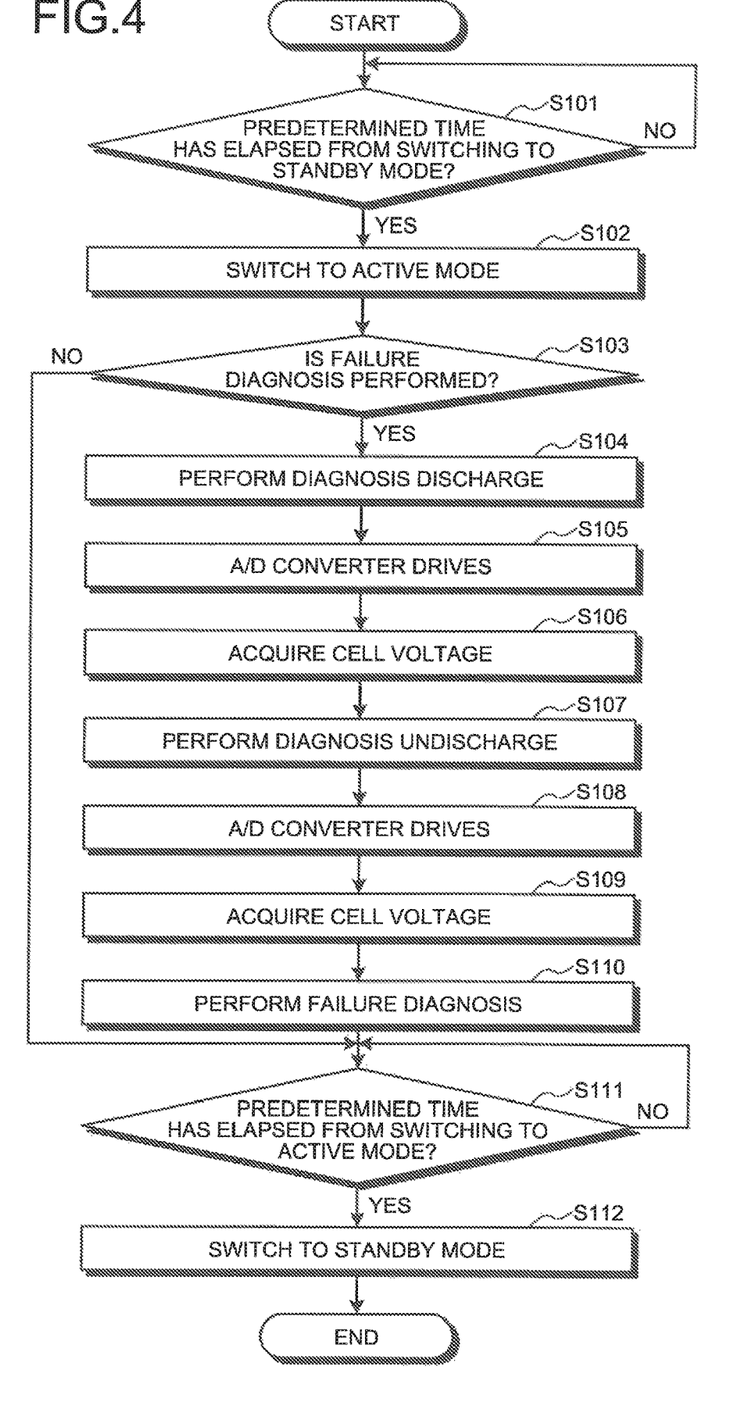
FIG. 4 is a flowchart illustrating a voltage detection process according to the first embodiment.

A voltage detection process performed by the voltage detecting device 1 will be explained by using FIG. 4. FIG. 4 is a flowchart illustrating a voltage detection process according to the embodiment. It is assumed that the voltage detecting device 1 repeatedly performs the voltage detection process illustrated in FIG. 4 while a vehicle on which the assembled battery B is mounted is traveling, for example.

First, the voltage detecting device 1 determines whether a predetermined time has elapsed from the switching into a standby mode (Step S101). When the predetermined time does not elapse (Step S101: No), the voltage detecting device 1 returns the process to Step S101 and waits for the passage of the predetermined time. On the other hand, when the predetermined time has elapsed (Step S101: Yes), the voltage detecting device 1 switches the operation mode of the detecting unit 10 from a standby mode to an active mode (Step S102).

Next, the voltage detecting device 1 determines whether it performs a failure diagnosis of the assembled battery B etc. (Step S103). When the failure diagnosis is not performed (Step S103: No), the process advances to Step S111. On the other hand, when the failure diagnosis is performed (Step S103: Yes), the voltage detecting device 1 performs diagnosis discharge of the battery cell in the diagnosis term T1 (Step S104).

The A/D converter 111 of the detecting unit 10 drives in the diagnosis term T1 to detect a cell voltage (Step S105). The voltage detecting device 1 acquires the cell voltage detected by the A/D converter 111 (Step S106).

Next, the voltage detecting device 1 performs diagnosis undischarge of the battery cell in the diagnosis term T2 (Step S107). In other words, the voltage detecting device 1 controls the battery cell not to discharge in the diagnosis term T2. The A/D converter 111 of the detecting unit 10 drives in the diagnosis term T2 to detect a cell voltage (Step S108). The voltage detecting device 1 acquires the cell voltage detected by the A/D converter 111 (Step S109).

The voltage detecting device 1 performs a failure diagnosis on the basis of the detected cell voltage (Step S110). Next, the voltage detecting device 1 determines whether a predetermined time has elapsed from the switching into an active mode in Step S102 (Step S111). When the predetermined time does not elapse (Step S111: No), the voltage detecting device 1 returns the process to Step S111 and waits for the passage of the predetermined time. On the other hand, when the predetermined time has elapsed (Step S111: Yes), the voltage detecting device 1 switches the operation mode of the detecting unit 10 from an active mode to a standby mode (Step S112), and terminates the process.

In FIG. 4, it has been illustrated that the voltage detecting device 1 performs both of diagnosis discharge and diagnosis undischarge. However, the present embodiment is not limited to this. The voltage detecting device 1 may perform any one of diagnosis discharge and diagnosis undischarge for the sake of a failure diagnosis.

In FIG. 4, it has been explained that the voltage detecting device 1 acquires a cell voltage during diagnosis discharge and a cell voltage during diagnosis undischarge and then performs a failure diagnosis. However, the present embodiment is not limited to this. For example, the voltage detecting device 1 may perform a failure diagnosis at the time when a cell voltage during diagnosis discharge is acquired. In this case, the voltage detecting device 1 performs a failure diagnosis between Step S106 and Step S107 of FIG. 4, for example.

As described above, the voltage detecting device 1 according to the present embodiment can switch between an active mode and a standby mode in accordance with a timing for detecting a cell voltage so as to detect a cell voltage at a desired timing. As a result, the voltage detecting device 1 can shorten the diagnosis term T1.

The voltage detecting device 1 can perform a failure diagnosis by using the A/D converter 111 of the voltage detecting unit 110 that detects a cell voltage regardless of the control from the controller 20. As described above, by performing voltage detection regardless of the control from the controller 20, it is possible to reduce a cost of circuits that constitute the voltage detecting unit 110.

Second Embodiment

Next, a voltage detecting device 1B according to the second embodiment will be explained by using FIGS. 5 to 8. Although the voltage detecting device 1 according to the first embodiment performs a failure diagnosis of the assembled battery B and the detecting unit 10 by using cell voltages, the voltage detecting device 1B according to the present embodiment performs a failure diagnosis on the basis of source voltages of the detecting unit 10. Therefore, the voltage detecting device 1B illustrated in FIG. 5 does not include the discharge control unit 210. Because the other configuration is the same as the voltage detecting device 1 illustrated in FIG. 2, the same components have the same reference numbers and their explanations are omitted.

Figure 5:
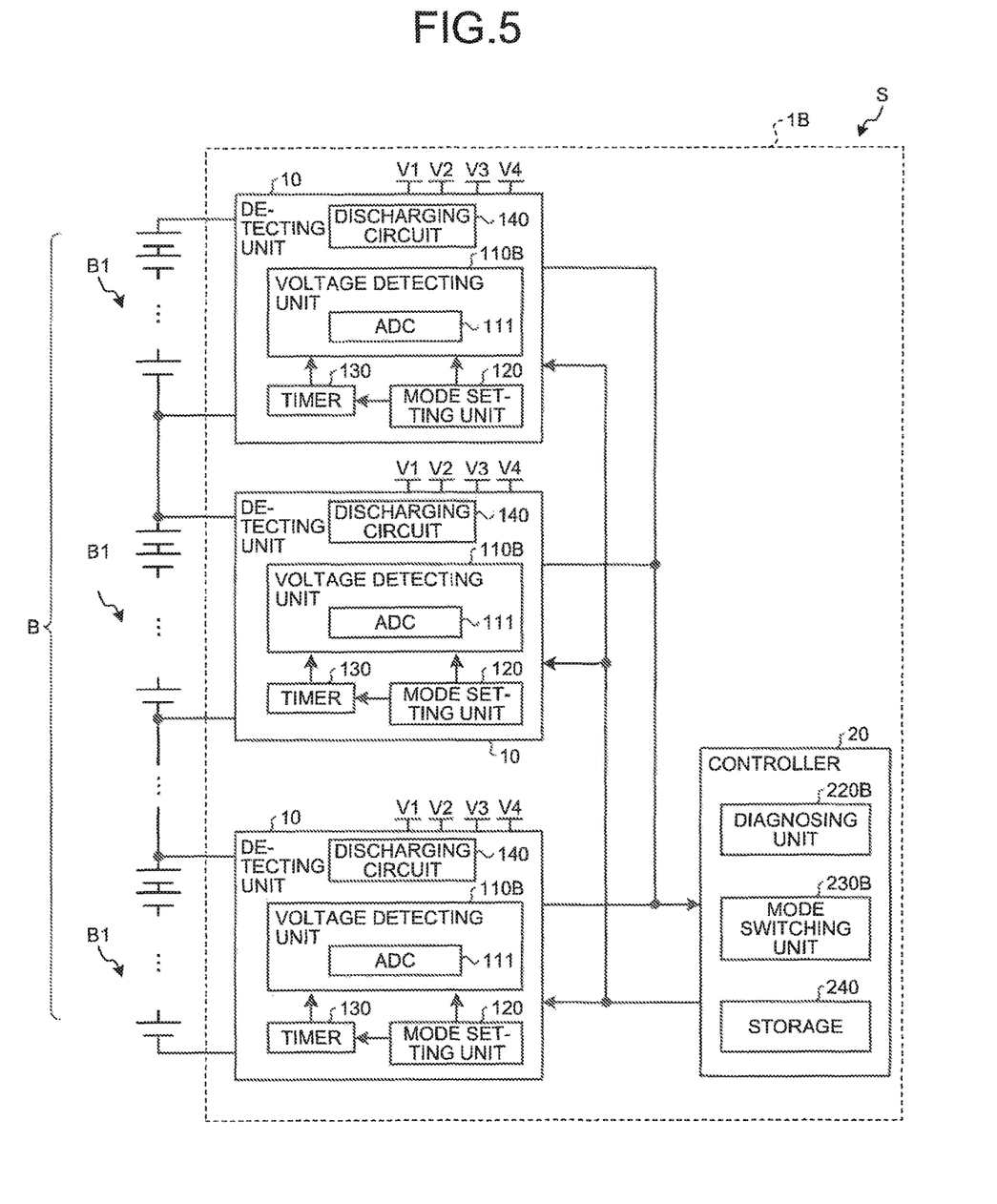
FIG. 5 is a diagram illustrating a configuration example of an assembled battery system according to a second embodiment.

As illustrated in FIG. 5, first to fourth source voltages V1 to V4 different from one another are input into the detecting unit 10 of the voltage detecting device 1B. The detecting unit 10 activates circuits such as the A/D converter 111 by using the first to fourth source voltages V1 to V4.

A voltage detecting unit 110B detects the first to fourth source voltages V1 to V4 in addition to cell voltages. A diagnosing unit 220B performs a failure diagnosis of the detecting unit 10 on the basis of the first to fourth source voltages V1 to V4 detected by the voltage detecting unit 110B. A mode switching unit 230B switches between a standby mode and an active mode on the basis of a timing at which the first to fourth source voltages V1 to V4 are detected.

Figure 6:
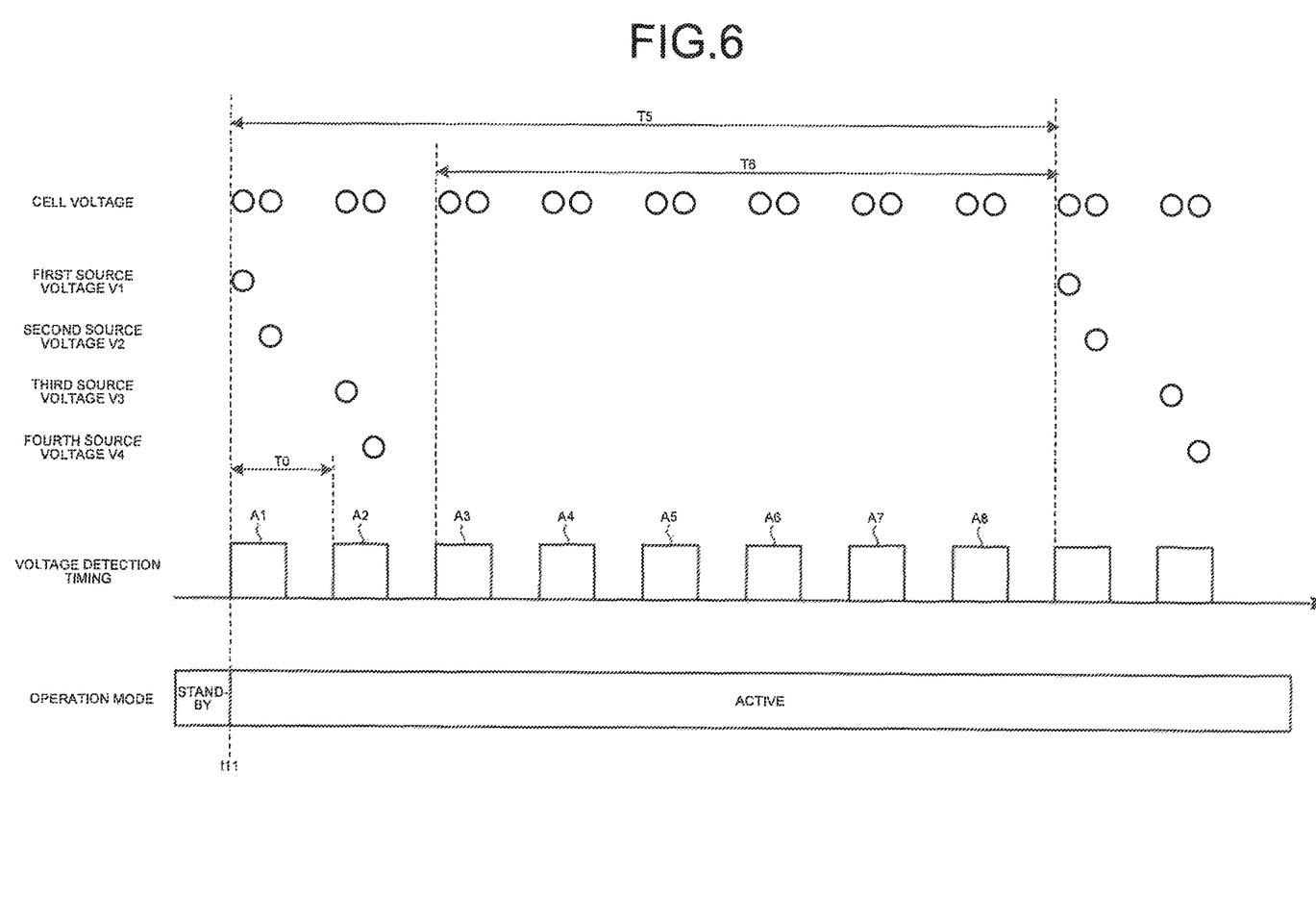
FIG. 6 is a diagram explaining operation timings of components of a voltage detecting device.

Herein, a case where switching between a standby mode and an active mode is not performed based on the timing at which the mode switching unit 230B detects the first to fourth source voltages V1 to V4 will be explained by using FIG. 6. In this case, it is assumed that, when switching from a standby mode to an active mode is performed at the timing t11, the mode switching unit 230B maintains the active mode without change. FIG. 6 is diagram explaining an operation timing of the voltage detecting device 1B.

As illustrated in FIG. 6, the voltage detecting unit 110B intermittently drives in the predetermined interval T0 from the timing t11 at which the mode is switched from a standby mode to an active mode, and detects cell voltages in the predetermined interval T0. The voltage detecting unit 1103 detects, in the one driving term A1, an odd-numbered cell voltage and an even-numbered cell voltage, for example. In other words, the voltage detecting unit 110B detects twice a cell voltage in the one driving term A1. A circle (○) illustrated in FIG. 6 indicates a timing at which the voltage detecting unit 1103 detects a voltage.

The voltage detecting unit 110B detects the first to fourth source voltages V1 to V4 in a predetermined interval T5 from the timing t11 at which the mode is switched from a standby mode to an active mode. For example, as illustrated in FIG. 6, the voltage detecting unit 110B detects the first and second source voltages V1 and V2 within the driving term A1 at the timing t11 at which the mode is switched from a standby mode to an active mode. Next, the voltage detecting unit 1103 detects the third and fourth source voltages V3 and V4 in a driving term A2 after the predetermined interval T0 has elapsed from the timing t11. In other words, although a cell voltage is detected twice in each of driving terms A1 to AB, the first to fourth source voltages V1 to V4 are detected only in the initial two driving terms A1 and A2 within the interval T5 by the timer.

Next, the detecting unit 10 detects the next first to fourth source voltages V1 to V4 in the next interval T5 after the predetermined interval T5 has elapsed from the timing t11 at which the switching into an active mode is performed. For that reason, the first to fourth source voltages V1 to V4 are not detected within a term T6, Therefore, the diagnosing unit 220B cannot acquire the first to fourth source voltages V1 to V4 within the term T6 from the voltage detecting unit 110B, and thus cannot perform a failure diagnosis that uses the first to fourth source voltages V1 to V4 within the term T6.

When determining k-times (k is one or more real number) that the first to fourth source voltages V1 to V4 have the abnormality, for example, the diagnosing unit 220B determines that the detecting unit 10 is breaking down. As illustrated in FIG. 6, when the voltage detecting unit 110B detects the first to fourth source voltages V1 to V4 in the predetermined interval T5, a time of T5×k is required until the diagnosing unit 2202 determines failure. For that reason, a term in which the diagnosing unit 220B performs a failure diagnosis becomes longer.

Figure 7:
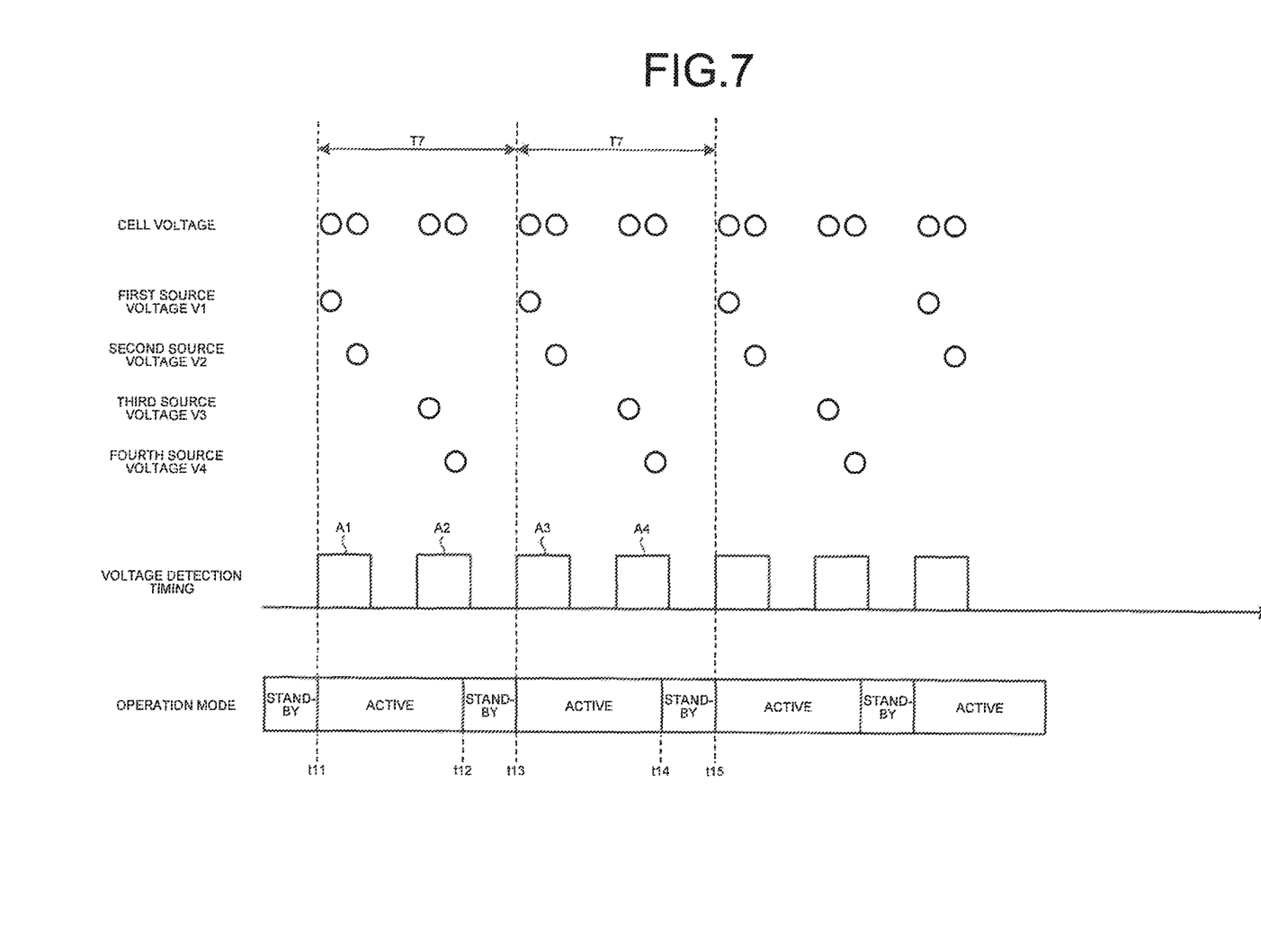
FIG. 7 is a diagram explaining operation timings of components of the voltage detecting device.

Therefore, the mode switching unit 230B according to the present embodiment performs switching between a standby mode and an active mode on the basis of the timing at which the first to fourth source voltages V1 to V4 are detected. In this case, a timing at which the voltage detecting unit 110B detects a voltage will be explained by using FIG. 7. FIG. 7 is a diagram explaining an operation timing of the voltage detecting device 1B. Moreover, because the step in which the voltage detecting unit 110B detects the first to fourth source voltages V1 to V4 in a term T7 after switching into an active mode at the timing t11 is the same as that of FIG. 6, their explanations are omitted.

As illustrated in FIG. 7, if the voltage detecting unit 110B detects the first to fourth source voltages in the driving term A2, the mode switching unit 230B switches the mode from an active mode to a standby mode at a timing t12. As a result, the timer 130 of the detecting unit 10 is reset at the timing t12.

Next, the mode switching unit 2308 switches the operation mode of the detecting unit 10 from a standby mode to an active mode at a timing t13. As a result, the voltage detecting unit 110B starts to detect a voltage. Because the timer 130 is reset at the timing t12, the voltage detecting unit 110B detects the first and second source voltages V1 and V2 in a driving term A3 in addition to the cell voltage. Moreover, the voltage detecting unit 110B detects the third and fourth source voltages V3 and V4 in the next driving term A4.

As described above, the mode switching unit 230B switches between an active mode and a standby mode to repeat the active mode in the period T7 shorter than the predetermined interval T5. As a result, the timer 130 is reset in the period T7, and the voltage detecting unit 110B detects the first to fourth source voltages V1 to V4 in the period T7.

Therefore, the diagnosing unit 220B of the voltage detecting device 1B can determine whether the first to fourth source voltages V1 to V4 have the abnormality in the period T7 shorter than the predetermined interval T5. As a result, the voltage detecting device 1B can shorten the term of the failure diagnosis.

Figure 8:
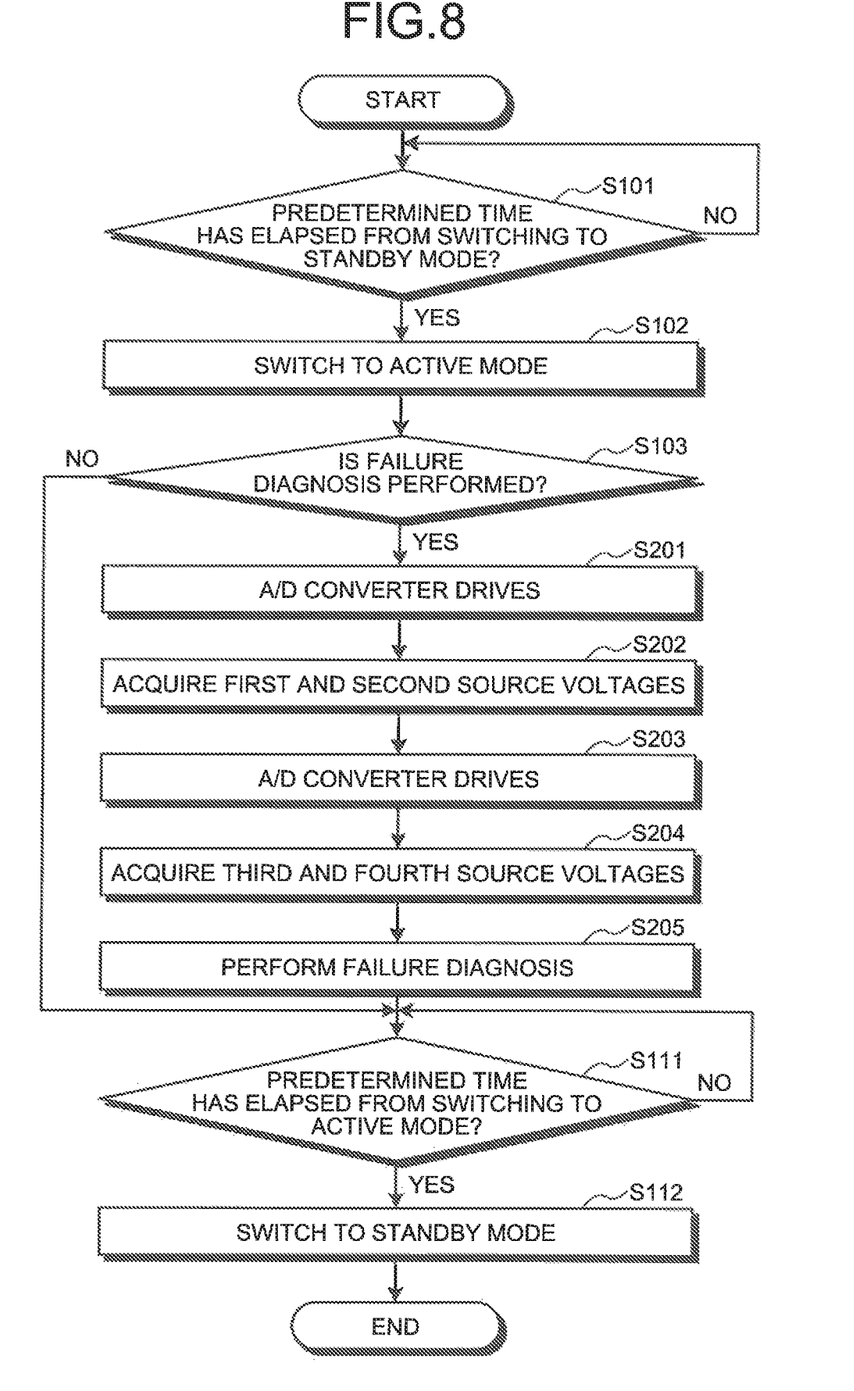
FIG. 8 is a flowchart illustrating a voltage detection process according to the second embodiment.

A voltage detection process performed by the voltage detecting device 1B will be explained by using FIG. 8. FIG. 8 is a flowchart illustrating the voltage detection process according to the present embodiment. It is assumed that the voltage detecting device 1B repeatedly performs the voltage detection process illustrated in FIG. 8 while a vehicle on which the assembled battery B is mounted is traveling, for example. Because the process of Steps S101 to S103 illustrated in FIG. 8 is the same as that of the voltage detection process illustrated in FIG. 4, their explanations are omitted.

As illustrated in FIG. 8, when the voltage detecting device 1B determines that a failure diagnosis is performed (Step S103: Yes) and the A/D converter 111 drives (Step S201), the voltage detecting device 1B acquires the first and second source voltages V1 and V2 (Step S202). Moreover, when the A/D converter 111 drives in the next driving term (Step S203), the voltage detecting device 1B acquires the third and fourth source voltages V3 and V4 (Step S204). The voltage detecting device 1B performs the failure diagnosis of the detecting unit 10 on the basis of the acquired first to fourth source voltages V1 to V4 (Step S205). Specifically, the voltage detecting device 1B determines whether the first to fourth source voltages V1 to V4 are an abnormal value, and determines that the detecting unit 10 has broken down when the source voltages continuously have the abnormal value by a predetermined number of times. Because the process of the following Steps S111 and S112 is the same as that of FIG. 4, their explanations are omitted.

In FIG. 8, it has been explained that the voltage detecting device 1B acquires the first to fourth source voltages V1 to V4 and then performs a failure diagnosis. However, the present embodiment is not limited to this. For example, the voltage detecting device 1B may perform a failure diagnosis at timings at which the first to fourth source voltages V1 to V4 are respectively acquired.

As described above, the voltage detecting device 1B according to the present embodiment switches between an active mode and a standby mode in accordance with the timing at which the voltage detecting unit 110B detects the first to fourth source voltages V1 to V4. As a result, the voltage detecting device 1B can detect the first to fourth source voltages V1 to V4 in the period T7 shorter than the predetermined interval T5 in which the first to fourth source voltages V1 to V4 are detected when maintaining an active mode, for example. Therefore, the voltage detecting device 1B can shorten the term of the failure diagnosis.

In the second embodiment, it has been explained that the voltage detecting device 1B performs a failure diagnosis by using source voltages instead of performing a failure diagnosis by using cell voltages. However, the present embodiment is not limited to this. For example, the voltage detecting device 1B may perform both of a failure diagnosis that uses cell voltages and a failure diagnosis that uses source voltages.

In this case, the mode switching unit 230B of the voltage detecting device 1B switches between an active mode and a standby mode in accordance with a timing for detecting cell voltages and a timing for detecting source voltages. For example, when the voltage detecting device 1B performs a failure diagnosis at the timings illustrated in FIGS. 3 and 7, the mode switching unit 230B controls to switch the operation mode from a standby mode to an active mode after the voltage detecting unit 110B drives twice. As a result, the voltage detecting device 1B can shorten a term needed for a failure diagnosis that uses cell voltages and a failure diagnosis that uses source voltages.

In the first and second embodiments, it has been explained that the assembled battery B includes the plurality of battery stacks B1_$n$ serially connected to each other, for example. The assembled battery B may include the plurality of battery stacks B1_$n$ connected to each other in parallel. Moreover, it has been explained that the battery stack B1_$n$ includes the plurality of battery cells serially connected to each other. The battery stack B1_$n$ may include the plurality of battery cells connected to each other in parallel.

The voltage detecting device 1, 1B according to the first and second embodiments includes the detecting unit 10 and the mode switching unit 230, 230B. The detecting unit 10 detects the voltages of the battery cells of the battery stack B1 in which the plurality of battery cells are connected to each other. The mode switching unit 230, 230B switches between an active mode in which the detecting unit 10 detects voltages and a standby mode in which currents flowing into the detecting unit 10 are less than a predetermined value. Moreover, the detecting unit 10 includes the voltage detecting unit 110, 110B that detects the voltages of the battery cells or/and the source voltages V1 to V4 of the detecting unit 10 in the predetermined interval T0. The mode switching unit 230, 230B switches between an active mode and a standby mode in accordance with the timing at which the voltage detecting unit 110, 110B detects the voltages.

As a result, the voltage detecting device 1, 1B can detect the voltages of the battery cells or/and the source voltages V1 to V4 of the detecting unit 10 at a desired timing. For that reason, the voltage detecting device 1, 1B can shorten a diagnosis term.

For the sake of a failure diagnosis of the battery cells or/and the detecting unit 10, the voltage detecting device 1 according to the first embodiment further includes the discharge control unit 210 that controls discharge or undischarge of the battery cells. Moreover, the mode switching unit 230 switches between an active mode and a standby mode on the basis of the timing at which the discharge control unit 210 performs discharge or undischarge of the battery cells.

As a result, the voltage detecting device 1 can detect the voltages of the battery cells at a desired timing. For that reason, the voltage detecting device 1 can shorten the diagnosis term.

For the sake of the failure diagnosis of the detecting unit 10, the mode switching unit 230B of the voltage detecting device 1B according to the second embodiment switches between an active mode and a standby mode on the basis of the timing at which the source voltages V1 to V4 of the detecting unit 10 are detected.

As a result, the voltage detecting device 1B can detect the source voltages V1 to V4 of the detecting unit 10 at a desired timing. For that reason, the voltage detecting device 1B can shorten the diagnosis term.

The voltage detecting unit 110, 110B of the voltage detecting device 1, 1B according to the first and second embodiments includes the A/D converter 111 that detects voltages in the predetermined interval T0 from the timing at which the mode switching unit 230, 230B switches the mode from a standby mode to an active mode.

As a result, the voltage detecting device 1, 1B can perform a failure diagnosis by using the A/D converter 111 that detects cell voltages regardless of the control from the controller 20. Therefore, it is possible to reduce a cost of circuits that constitute the voltage detecting unit 110, 110B.

The mode switching unit 230, 230B of the voltage detecting device 1, 1B according to the first and second embodiments switches the mode from a standby mode to an active mode when the voltage detecting unit 110, 110B detects a voltage by a predetermined number of times.

As a result, the voltage detecting device 1, 1B can shorten the diagnosis term.

According to an aspect of embodiments, it is possible to shorten a diagnosis term of a failure.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A voltage detecting device comprising:
a detecting unit that detects voltages of battery cells of a battery stack in which the battery cells are connected to each other;
a mode switching unit that switches an operation mode of the detecting unit between an active mode in which the detecting unit detects the voltages and a standby mode in which a current flowing into the detecting unit is less than a predetermined value; and
a discharge control unit that controls a discharging circuit which is connected to the battery cells to discharge or non-discharge the battery cells,
wherein the detecting unit includes a voltage detecting unit that detects during the active mode, in a predetermined interval from a timing at which the mode switching unit switches the operation mode of the detecting unit from the standby mode to the active mode, the voltages of the battery cells and a voltage of a power supply of the detecting unit,
the discharge control unit is configured to:
during an adjustment term in which balance between voltages of the battery cells is adjusted, cause the discharging circuit to perform adjustment discharge for adjusting capacity balance between the battery cells in accordance with the voltages of the battery cells detected by the voltage detecting unit; and
during a diagnosis term, control the discharging circuit to determine whether one or both of the battery cells and the detection unit has a failure,
the diagnosis term is executed after a passage of a predetermined delay following the adjustment term, and
the mode switching unit switches the operation mode of the detecting unit from the standby mode to the active mode within the diagnosis term.

2. The voltage detecting device according to claim 1, wherein the mode switching unit switches between the active mode and the standby mode based on a timing at which the discharge control unit performs the discharge or non-discharge of the battery cells.

3. The voltage detecting device according to claim 1, wherein the mode switching unit switches, for a failure diagnosis of the detecting unit, between the active mode and the standby mode based on a timing at which the voltage of the power supply of the detecting unit is detected.

4. The voltage detecting device according to claim 1, wherein the voltage detecting unit includes an A/D converter that detects the voltages in the predetermined interval from a timing at which the mode switching unit switches from the standby mode to the active mode.

5. The voltage detecting device according to claim 1, wherein the mode switching unit switches from the active mode to the standby mode when the voltage detecting unit detects the voltages a predetermined number of times during a predetermined time period.

6. A voltage detecting method comprising:
(a) detecting, by a detecting unit, voltages of battery cells of a battery stack in which the battery cells are connected to each other;
(b) switching an operation mode of the detecting unit between an active mode in which the voltages are detected by the detecting unit and a standby mode in which a current flowing into the detecting unit is less than a predetermined value; and
(c) controlling a discharging circuit which is connected to the battery cells to discharge or non-discharge the battery cells,
wherein the (a) detecting includes detecting during the active mode, in a predetermined interval from a timing at which the (b) switching the operation mode of the detecting unit from the standby mode to the active mode occurs, the voltages of the battery cells and a voltage of a power supply of the detecting unit,
the (c) controlling the discharging circuit includes:
during an adjustment term in which balance between voltages of the battery cells is adjusted, causing the discharging circuit to perform adjustment discharge for adjusting capacity balance between the battery cells in accordance with the detected voltages of the battery cells; and
during a diagnosis term, controlling the discharging circuit to determine whether one or both of the battery cells and the detection unit has a failure,
the diagnosis term is executed after a passage of a predetermined delay following the adjustment term, and
the (b) switching includes switching the operation mode of the detecting unit from the standby mode to the active mode within the diagnosis term.

* * * * *